United States Patent [19]

Sazzad et al.

[11] Patent Number: 6,035,434

[45] Date of Patent: Mar. 7, 2000

[54] SYSTEM AND METHOD FOR BIT INTERLEAVING OF HALF-RATE SPEECH DATA

[75] Inventors: Sharif M. Sazzad, North Brunswick, N.J.; Jagannathan Bharath, Austin, Tex.

[73] Assignee: Advanced Micro Devices, Inc., Sunnyvale, Calif.

[21] Appl. No.: 08/873,941

[22] Filed: Jun. 12, 1997

[51] Int. Cl.[7] .................................................... G06F 11/00
[52] U.S. Cl. ......................... 714/776; 714/752; 714/701
[58] Field of Search .................................. 714/743, 776, 714/701, 752; 341/147; 358/456; 380/20; 370/528; 348/470

[56] References Cited

U.S. PATENT DOCUMENTS

| | | | |
|---|---|---|---|
| 4,318,126 | 3/1982 | Sassler | 348/470 |
| 4,750,173 | 6/1988 | Blüthgen | 370/528 |
| 4,989,244 | 1/1991 | Naruse et al. | 380/20 |
| 5,146,554 | 9/1992 | Statt | 358/456 |
| 5,237,324 | 8/1993 | Linz et al. | 341/147 |
| 5,420,870 | 5/1995 | Kim | 714/743 |

OTHER PUBLICATIONS

Global System for Mobile Communications' Technical Specification 05.03 (GSM 05.03) Digital cellular telecommunications system (Phase 2+); Channel coding: version 5.1.0, May 1996, pp. 1–31.

*Primary Examiner*—Hoa T. Nguyen
*Assistant Examiner*—David Ton
*Attorney, Agent, or Firm*—Conley, Rose & Tayon; Jeffrey C. Hood; Dan J. Krueger

[57] ABSTRACT

A memory-efficient system and method for generating data blocks "on demand" for TDMA data bursts. In one embodiment of the present invention, a GSM transmitter module converts forward error correction (FEC) coded half-rate speech frames into TDMA data blocks. The transmitter module includes a memory configured to store the FEC coded frames in a current frame buffer and a previous frame buffer, an address generator configured to generate addresses of words in the current frame buffer during even clock cycles and addresses of words in the previous frame buffer during odd clock cycles. To generate the word addresses, the address generator operates on word offsets provided by a bit position generator, which also generates intra-word bit offsets. The memory provides the data words requested by the address generator to a multiplexer, which the selects a bit from each of the data words as indicated by the intra-word bit offsets from the bit position generator. The stream of bits from the multiplexer forms the bit reordered and frame interleaved data for the data blocks.

16 Claims, 10 Drawing Sheets

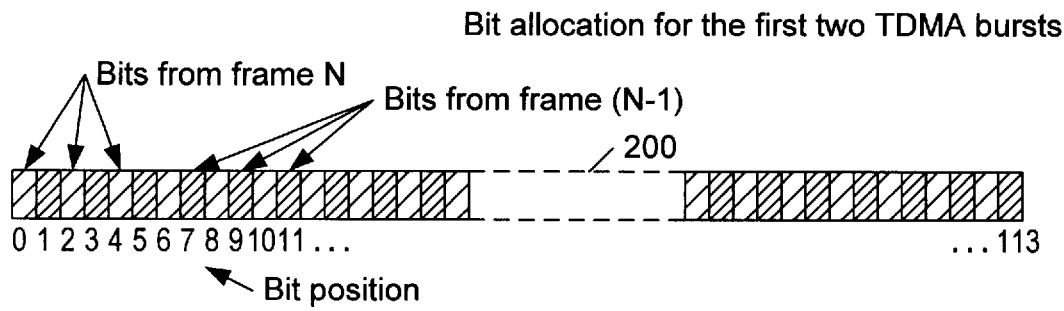
FIG. 5
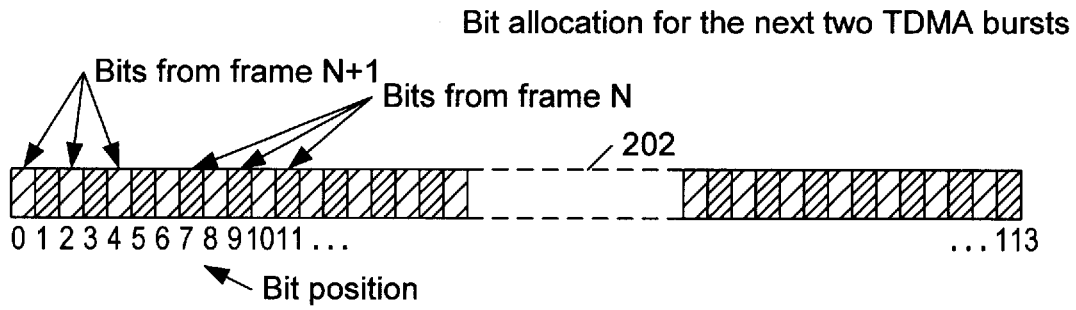
FIG. 6
Table 1: Dependence of n(Bj) on B and j
| Burst | j even | j odd |
|---|---|---|
| $B_0$ | N | N-1 |
| $B_0+1$ | N | N-1 |
| $B_0+2$ | N+1 | N |
| $B_0+3$ | N+1 | N |
FIG. 7

Table 2: Values of k(B,j)

| B%4 | 0 | 1 | | 2 | 3 |
|---|---|---|---|---|---|
| j=0 | k=0 | 150 | j=1 | k=1 | 151 |
| 2 | 38 | 188 | 3 | 39 | 189 |
| 4 | 76 | 226 | 5 | 77 | 227 |
| 6 | 114 | 14 | 7 | 115 | 15 |
| 8 | 152 | 52 | 9 | 153 | 53 |
| 10 | 190 | 90 | 11 | 191 | 91 |
|  | 18 | 128 |  | 19 | 129 |
|  | 56 | 166 |  | 57 | 167 |
|  | 94 | 204 |  | 95 | 205 |
|  | 132 | 32 |  | 133 | 33 |
| 20 | 170 | 70 | 21 | 171 | 71 |
|  | 208 | 108 |  | 209 | 109 |
|  | 8 | 146 |  | 9 | 147 |
|  | 46 | 184 |  | 47 | 185 |
|  | 84 | 222 |  | 85 | 223 |
| 30 | 122 | 10 | 31 | 123 | 11 |
|  | 160 | 48 |  | 161 | 49 |
|  | 198 | 86 |  | 199 | 87 |
|  | 28 | 124 |  | 29 | 125 |
|  | 66 | 162 |  | 67 | 163 |
| 40 | 104 | 200 | 41 | 105 | 201 |
|  | 142 | 30 |  | 143 | 31 |
|  | 180 | 68 |  | 181 | 69 |
|  | 218 | 106 |  | 219 | 107 |
|  | 4 | 144 |  | 5 | 145 |
| 50 | 42 | 182 | 51 | 43 | 183 |
|  | 80 | 220 |  | 81 | 221 |
|  | 118 | 6 |  | 119 | 7 |
|  | 156 | 44 |  | 157 | 45 |
|  | 194 | 82 |  | 195 | 83 |
| 60 | 22 | 120 | 61 | 23 | 121 |
|  | 60 | 158 |  | 61 | 159 |
|  | 98 | 196 |  | 99 | 197 |
|  | 136 | 24 |  | 137 | 25 |
|  | 174 | 62 |  | 175 | 63 |
|  | 212 | 100 |  | 213 | 101 |
| 70 | 12 | 138 | 71 | 13 | 139 |
|  | 50 | 176 |  | 51 | 177 |
|  | 88 | 214 |  | 89 | 215 |
|  | 126 | 2 |  | 127 | 3 |
| 80 | 164 | 40 | 81 | 165 | 41 |
|  | 202 | 78 |  | 203 | 79 |
|  | 34 | 116 |  | 35 | 117 |
|  | 72 | 154 |  | 73 | 155 |
|  | 110 | 192 |  | 111 | 193 |
| 90 | 148 | 26 | 91 | 149 | 27 |
|  | 186 | 64 |  | 187 | 65 |
|  | 224 | 102 |  | 225 | 103 |
|  | 16 | 140 |  | 17 | 141 |
|  | 54 | 178 |  | 55 | 179 |
| 100 | 92 | 216 | 101 | 93 | 217 |
|  | 130 | 20 |  | 131 | 21 |
|  | 168 | 58 |  | 169 | 59 |
|  | 206 | 96 |  | 207 | 97 |
|  | 36 | 134 |  | 37 | 135 |
| 110 | 74 | 172 | 111 | 75 | 173 |
| 112 | 112 | 210 | 113 | 113 | 211 |

FIG. 8

Table 3: Initialization table for k(B,j)

| Position | Value |
|---|---|
| 0 | 0 |
| 12 | 18 |
| 24 | 8 |
| 36 | 28 |
| 48 | 4 |
| 60 | 22 |
| 72 | 12 |
| 84 | 34 |
| 96 | 16 |
| 108 | 36 |
| 120 | 14 |
| 132 | 32 |
| 144 | 10 |
| 156 | 30 |
| 168 | 6 |
| 180 | 24 |
| 192 | 2 |
| 204 | 26 |
| 216 | 20 |

FIG. 9

SYSTEM AND METHOD FOR BIT INTERLEAVING OF HALF-RATE SPEECH DATA

Related U.S. patent application Ser. No. 08/873,625 filed Jun. 12, 1997, titled "A system and method for hardware-based bit interleaving of full-rate speech data", whose inventors are S. Sazaad, J. Bharath, and Tony Sawan, now pending is hereby incorporated by reference as though completely and in its entirety set forth herein.

BACKGROUND OF THE INVENTION

1. Field of the Invention

The present invention relates to methods of interleaving bits for coding, transmission, or storage, and more specifically to implementations of the bit re-ordering table for half-rate speech, Table 4 in GSM 05.03.

2. Description of Related Art

A method for encoding half rate speech is specified in the Global System for Mobile Communications' technical specification 05.03 (GSM 05.03) "Digital cellular telecommunications system (Phase 2+); Channel coding" version 5.1.0, May 1996. This publication is hereby incorporated by reference as though completely set forth herein.

The encoding method includes an interleaving process which is carried out in order to combat the burst errors that occur due to the mobile channel. Interleaving helps to separate out the individual errors within any error bursts and thereby effectively randomize the bit errors that are present. Then it is the job of a random error correcting code such as a convolutional code to correct as many of the errors as possible. The interleaver operates to reorder and spread bits from forward error correction (FEC) coded frames into data blocks for time division multiple access (TDMA) data bursts.

SUMMARY OF THE INVENTION

The present invention provides a memory-efficient system and method for generating data blocks "on demand" for TDMA data bursts. This system and method feature a novel approach which treats the problem not as one of having a buffer of bits to encode and then for each bit finding the destination in the TDMA data bursts, but rather the reverse, i.e. to consider each TDMA burst individially and then to find in the input buffers the source bits to be used. In one embodiment of the present invention, a GSM transmitter module converts forward error correction (FEC) coded half-rate speech frames into TDMA data blocks. The transmitter module includes a memory configured to store the FEC coded frames in a current frame buffer and a previous frame buffer, an address generator configured to generate addresses of words in the current frame buffer during even clock cycles and addresses of words in the previous frame buffer during odd clock cycles. To generate the word addresses, the address generator operates on word offsets provided by a bit position generator, which also generates intra-word bit offsets. The memory provides the data words requested by the address generator to a multiplexer, which the selects a bit from each of the data words as indicated by the intra-word bit offsets from the bit position generator. The stream of bits from the multiplexer forms the bit reordered and frame interleaved data for the data blocks.

In a preferred embodiment, the present invention comprises a method for bit reordering and frame interleaving for half rate speech in a GSM system. The method includes receiving two frames of forward error correction coded speech data and storing each frame in a separate buffer. The method also includes transferring bits from the buffers to a TDMA block. Each bit transfer includes determining the base address of one of the buffers, calculating a word offset within the selected buffer, calculating a bit offset within the selected word, and transferring the selected bit to a bit position in the TDMA block.

BRIEF DESCRIPTION OF THE FIGURES

Objects and advantages of the invention will become apparent upon reading the following detailed description and upon reference to the accompanying drawings in which:

FIG. 5 is a data block illustrating the bit distribution from FEC coded frames (N−1) and N;

FIG. 6 is a data block illustrating the bit distribution from FEC coded frames N and (N+1);

FIG. 7 is a table summarizing how the frame bits from the FEC coded frames are distributed according to burst number;

FIG. 8 is a tabulation of the source bit position as a function of burst number and destination bit position;

FIG. 9 is a table summarizing initialization values for the source bit position function;

Figure 1:
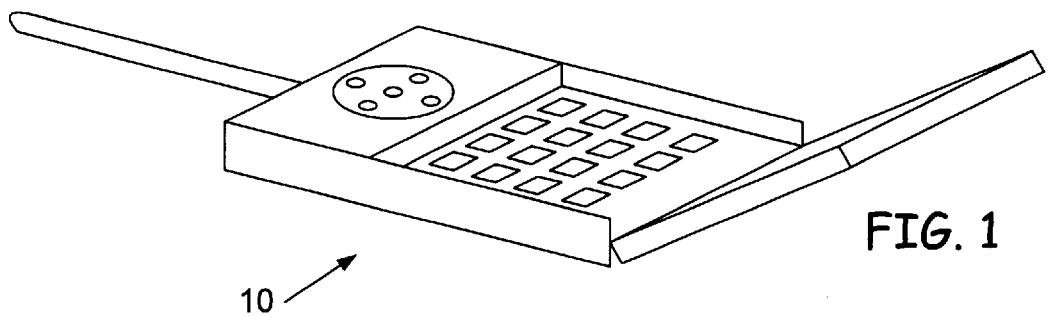
FIG. 1 is a GSM handset having a transmitter module according to present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the
}

DETAILED DESCRIPTION

Figure 2:
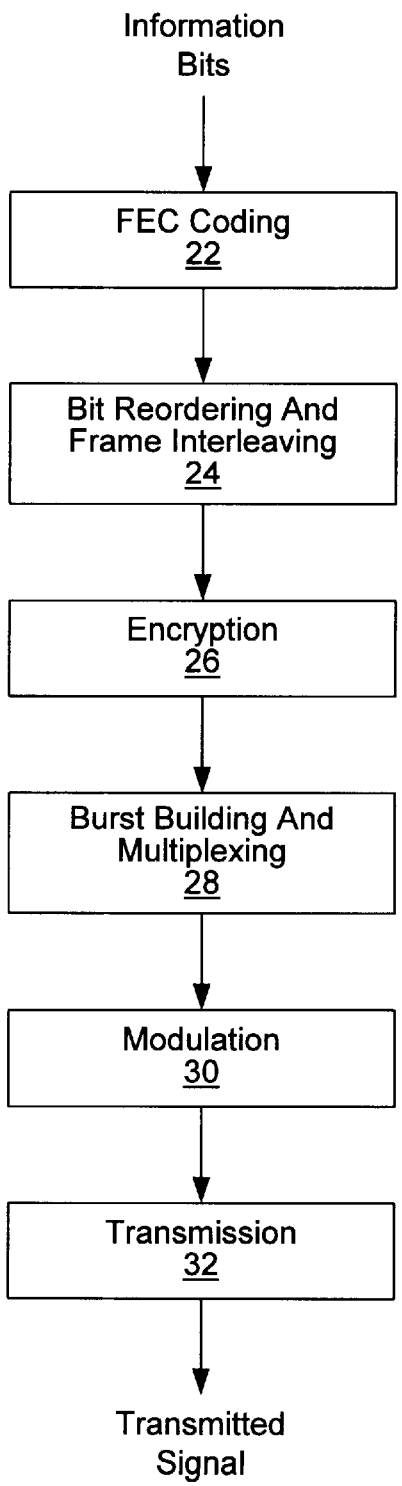
FIG. 2 is a functional block diagram of the transmitter module.

Turning now to FIG. 1, a GSM handset 10 is shown. Handset 10 has a transmitter module for converting information bits, e.g. compressed speech data, into a transmitted signal. FIG. 2 shows a functional block diagram of the transmitter module. The stream of information bits is error correction encoded into frames in block 22. The frames are sent to an interleaver module 24, which operates to reorder the bits and interleave the frames into data blocks for TDMA data bursts. The data blocks are encrypted in block 26, then in block 28 the encrypted blocks are incorporated into TDMA bursts (one encrypted data block per burst). The TDMA bursts are multiplexed, then forwarded to block 30 for modulation. Finally, the modulated signal is transmitted in block 32.

The interleaver module 24 receives a sequence of forward error correction (FEC) coded frames of half-rate speech data. Each frame has 228 bits which are to be reordered and spread out over four data blocks for transmission. The data blocks each have 114 bits which are provided by the current and previous frames. Hence the mapping from frames to blocks occurs on two levels, a bit level and a frame level.

The bit interleaving is called "bit reordering" in the GSM specification, however it is, nonetheless, interleaving on a bit level. The frame interleaving involves the interleaving of speech data from consecutive speech frames. This helps to spread out any burst errors over two independently FEC coded speech frames, which is better than spreading the same number of bit errors out over one FEC coded speech frame as would be the case if frame interleaving did not occur.

The interleaving scheme may be described using the equation shown below:

$$i(B,j) = c(n(B,j), k(B,j))$$

where $i(B,j)$ is the $j^{th}$ bit in the $B^{th}$ block and the source bit, $c(n(B,j), k(B,j))$, is the $k(B,j)^{th}$ bit in the $n(B,j)^{th}$ FEC coded speech frame. The variables k and n are stated as functions of B and j because it is intended that B and j be the independent variables in the iteration of this interleaving scheme. This is to be contrasted with the method described in the GSM specification, where n and k are the independent variables. The advantages of this approach will be described further below. The function $n(B,j)$ is used because the source bit can be from either the $(N-1)$th or the Nth FEC coded speech frame, depending on B and j. The position of the actual source bit is denoted by $k(B,j)$ and is also a function of B and j.

Figure 3:
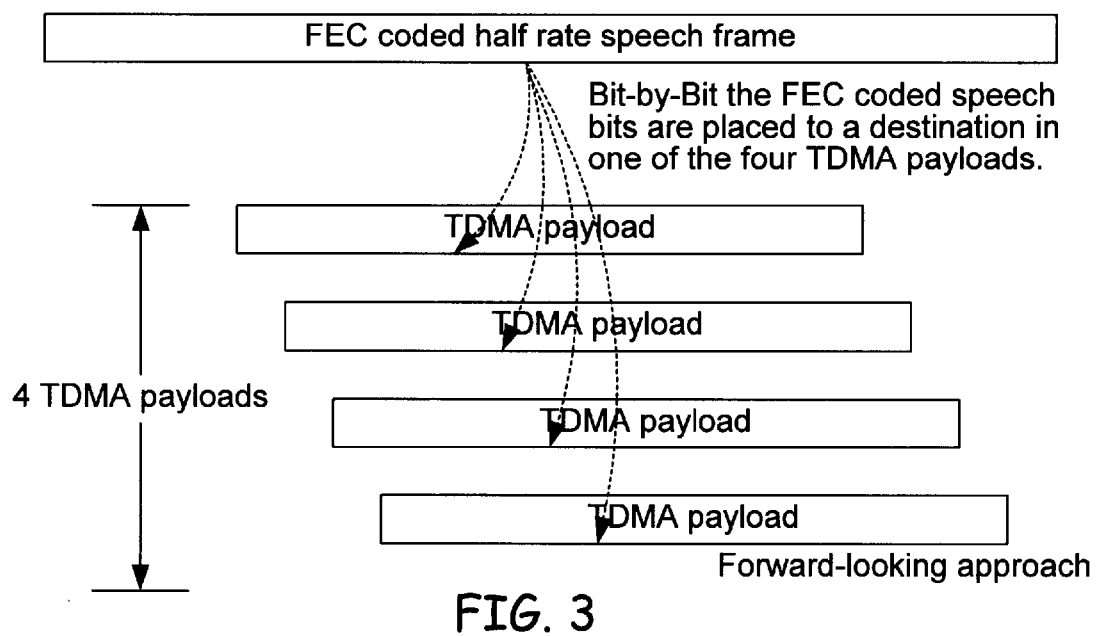
FIG. 3 is an illustration of a forward-looking approach to the interleaving process.
Figure 4:
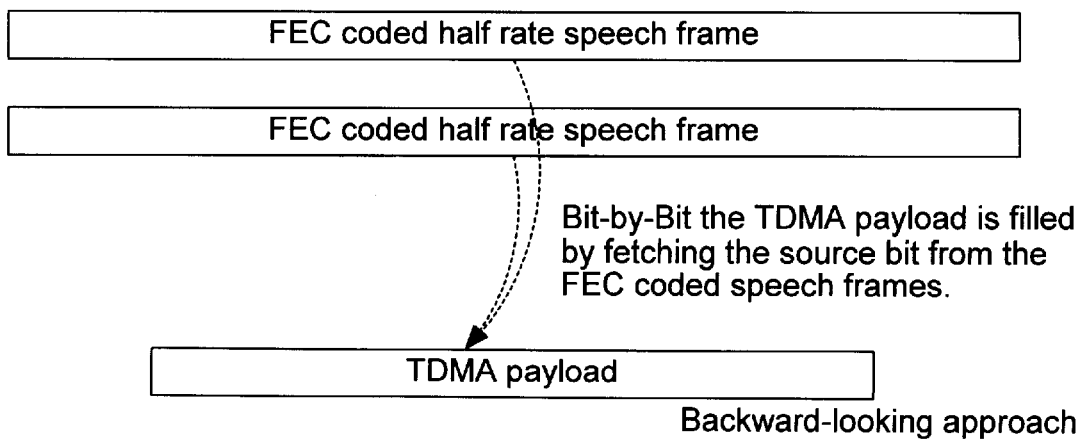
FIG. 4 is an illustration of a backward-looking approach to the interleaving proces.

This reordering/interleaving process is different from that given in the GSM specification, although the result is not. In the GSM specification, a serial approach is taken to distribute the source bits of a given frame throughout four data blocks. This forward-looking approach is illustrated in FIG. 3. The FEC frame is processed on a bit by bit basis so that four data blocks are being built at a time. In the current approach, the reordering and interleaving algorithm is considered by taking the final result, i.e. the interleaved bits which form a given data block, and looking backwards to determine the source, i.e. the uninterleaved FEC coded bits. This backward-looking approach is illustrated in FIG. 4. Two FEC frames are used as sources for a data block which is built on a bit by bit basis. This results in the algorithmic relationship shown above.

The following two sections attempt to better explain the functions $n(B,j)$ and $k(B,j)$. Each section describes the various factors that contribute to the nature of the two functions. The final section presents a hardware model for a possible implementation of the reordering/interleaving algorithm.

Explanation of $n(B,j)$

The function $n(B,j)$ determines which FEC coded speech frame to use as the source of the bit to be interleaved, and it depends on the data block number B and the bit position, j, in the data block. The transmission of FEC coded speech frames is spread out over four consecutive TDMA bursts (one data block per burst). This means that if the transmission of the $N^{th}$ FEC coded speech frame begins at burst $B=B_0$ then the bursts $B=B_0$, $B_0+1$, $B_0+2$, and $B_0+3$ will all contain some bits from the $N^{th}$ FEC coded speech frame. Further, due to the frame level interleaving, the first two data blocks, $B_0$ and $B_0+1$, contain bits from the $(N-1)^{th}$ and the $N^{th}$ FEC coded speech frames while the last two data blocks, $B_0+2$ and $B_0+3$, will contain bits from the $N^{th}$ and the $(N+1)^{th}$ FEC coded speech frames.

After deciding upon which two FEC coded speech frames are to be used in a particular data block, it remains to be determined which of the two frames are to be used as the source for a particular bit within the data block. There is an underlying rule that may be inferred from the GSM interleaving specification—the most recent FEC coded speech frame is used as the source for the even bits of the TDMA burst, while the previous FEC coded speech frame is used as the source for the odd bits of the TDMA burst. This is why there is a j dependency in $n(B,j)$.

With this rule in mind it is clear that the first two data blocks will use bits from frame N for even values of the bit position j and bits from frame $(N-1)$ for odd values of the bit position j. FIG. 5 shows a data block 200 whose even bit positions (e.g. positions 0, 2, 4) have values drawn from frame N and whose odd bit positions (e.g. positions 7, 9, 11) have values drawn from frame $(N-1)$. After the first two data blocks, the frame $(N-1)$ has been transmitted in full and new FEC coded speech frame $(N+1)$ becomes available for interleaving. As the $(N+1)^{th}$ frame is newer than the $N^{th}$ frame, bits from the $(N+1)$th frames are now mapped to the even position of the next four data blocks and bits from the Nth frame are now mapped into the odd positions. FIG. 6 shows a data block 202 whose even bit positions have values drawn from frame $(N+1)$ and whose odd bit positions have values drawn from frame N.

This explains the dependence of $n(B,j)$ on B and j. The table shown in FIG. 7 summarizes the dependence. The left column holds the burst number, the assumption is that the transmission of the $N^{th}$ FEC coded speech frame begins at the $B_0^{th}$ TDMA burst. The table shows which FEC coded speech frame to use as the source of the bit to be interleaved depending on the burst number B and the bit position j.

From the table it can be seen that for the first two TDMA bursts, frame N is used as the source for the even bits and frame $(N-1)$ for the odd bits. Then for the next two TDMA bursts, frame $(N+1)$ is used as the source for the even bits and frame N for the odd bits. Once the source frame has been established it remains to be determined which bit within that frame to select. This is where $k(B,j)$ is used.

Explanation of $k(B,j)$

The function $k(B,j)$ determines the position of the bit that is drawn from the $n(B,j)^{th}$ FEC coded speech frame. This bit will then be interleaved to the $j^{th}$ position in the $B^{th}$ data block. $k(B,j)$ depends on the TDMA burst number B and the bit position, j, and is tabulated in FIG. 8. The equations below shows a method that may be used to compute $k(B,j)$:

$$k(B,j+2)=k(B,j)+38$$

$$k(B,j+1)=k(B,j)+1$$

where j is even and k(B,j)<190. Unfortunately, these equations are not sufficient to generate the table in FIG. 8, since k(B,j) must be re-initialized after every time it exceeds 189.

The initial values of k(B,j) may be initialized depending on the values of B and j, or more conveniently, they may be initialized every sixth step, after k(B,j) exceeds 189, as will be discussed further below. The table in FIG. 8 shows the values of k(B,j). The values of bit position j and burst number B determine the entry in the table for a given k(B,j). As each FEC coded speech frame is spread out over four TDMA bursts, there are four columns of k(B,j) values. These four columns are grouped into two groups, each group with two columns. The entries for the first two columns correspond to the even bit positions of a data block and those for the last two columns, the odd bit positions. The j values placed at the side of each group of two columns reflect this.

The initialization of k(B,j) occurs at every sixth value, beginning with k(0,0), in the first group of columns in FIG. 8. The initialization values are taken from these columns and are shown explicitly in the table of FIG. 9. Returning to FIG. 8, the jumble of values in the columns represents the bit reordering (equivalently bit interleaving) that is specified by the GSM specification. The frame interleaving occurs when, for example, the even positioned bits from the first column (column 0) for frame N are interspersed with the odd positioned bits from the third column (column 2) for frame (N−1). Although the bit reordering and the frame interleaving are defined separately in the GSM standard, they may be combined into one process. This is done in this implementation.

Figure 10:
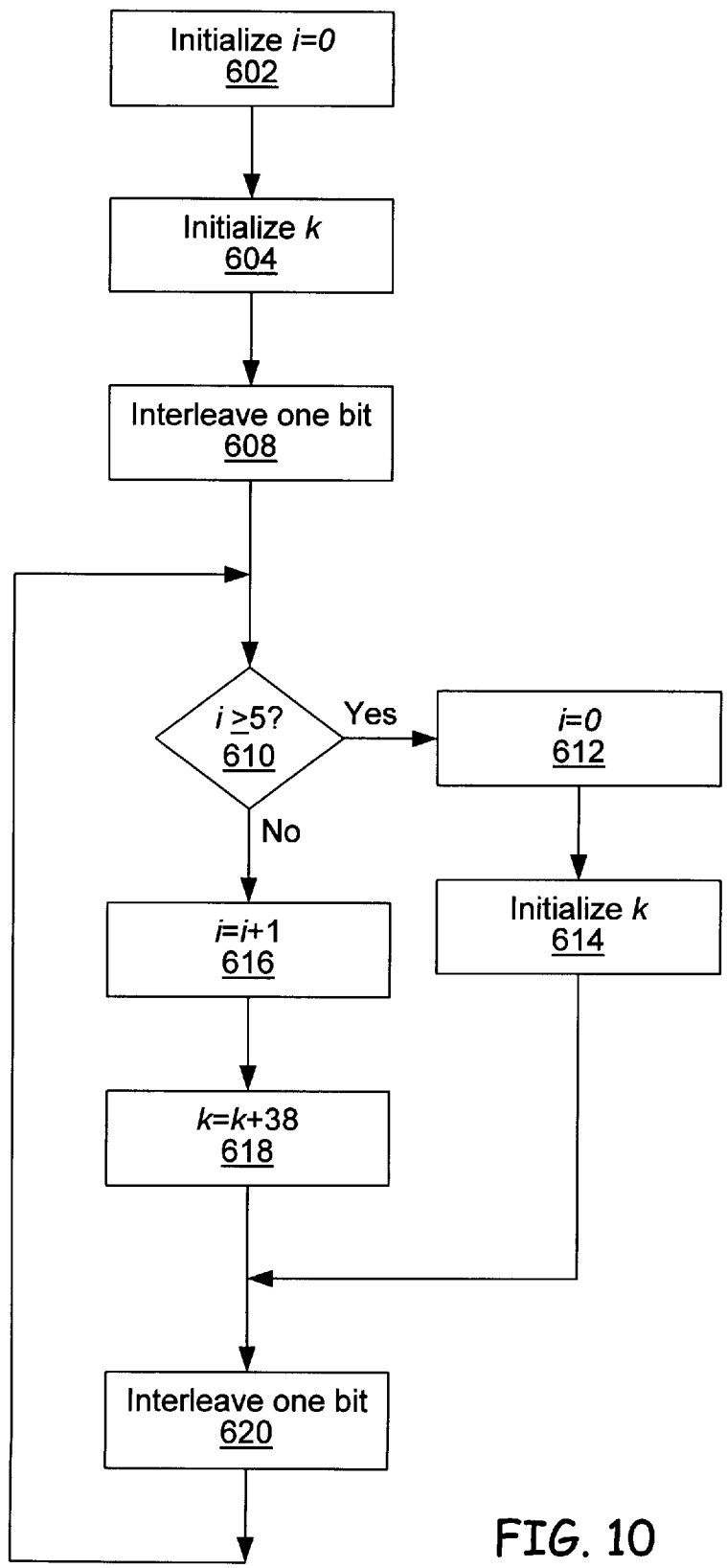
FIG. 10 is a flowchart of a method for implementing the bit position generation function.

FIG. 10 shows a flowchart 600 illustrating a method for computing destination positions for a data reordering/interleaving process. It is a method that may be used to compute the source position of the next sample within a data block. As there is data from two speech frames in each data block, there are two pointers, one for each frame buffer. These pointers are actually offset from each other by 1. The first pointer may use the method shown in the flowchart to compute the next position, and the second pointer may be determined by simply incrementing the first by 1.

The method begins with step 602 wherein an index counter i is set to 0, and step 604 wherein k(B,j) is set to an initial value 0 which depends on the assumption that burst number B is divisible by four and first position j is equal to 0. In step 608, the frame data located at this initial bit position value is placed in the data block at position j, and j is incremented by 2. In step 610, index counter i is tested to determine if it is time to re-initialize bit position k. If so, then in step 612 index counter i is reset to 0, and in step 614 bit position k is set to the appropriate value for the current value of position j according to the table in FIG. 9. If not, then in step 616, index counter i is incremented by one, and in step 618 bit position k is incremented by 38. After step 614 or step 618, step 620 is performed, in which the frame data located at bit position k is placed in the data block at position j and j is incremented by 2 modulo 114. The method then returns to step 610.

The data retrieval from memory is complicated slightly because of the bit manipulations that are involved. The values generated by the method are bit positions and the bits that they address are packed in 16-bit words.

To summarize, the issues which must be addressed by a hardware implementation are: 1) generating the correct values of n(B,j), 2) generating the correct values of k(B,j), 3) fetching the bit determined by k(B,j), and 4) providing a hardware control function. These issues are addressed in the following sections.

Implementing n(B,j)

The function n(B,j) is used to determine which FEC speech frame is used as the source for the $j^{th}$ bit. The initialization of n(B,0) is the most important issue here. Since the source bits come from two consecutive FEC speech frames that are stored in separate buffers, it is important to determine which buffer to use as the source for the very first bit. After the source of the first bit has been established, the remaining bits are obtained by alternating between the two buffers.

Figure 11:
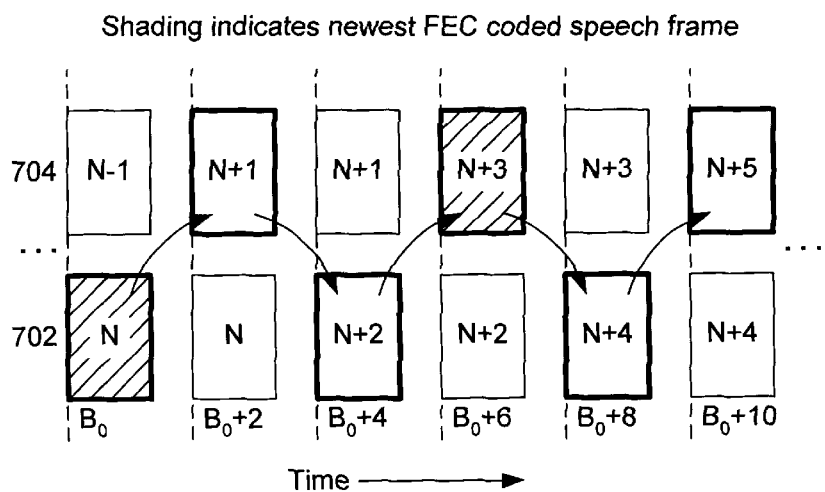
FIG. 11 is a figure illustrating the evolution of the current frame buffer and previous frame buffer locations.

The initialization of n(B,0) is determined from FIG. 7. In a hardware implementation with two buffers, an incoming FEC speech frame is placed into the "elder" of the two buffers. This is shown in FIG. 11. Buffers 702 and 704 alternate roles as the elder of the two buffers. Reading the diagram from the left, frame (N−1) is overwritten by frame (N+1) when it becomes available. Then frame N is replaced with frame (N+2) and so on. The blocks with thicker borders indicate the buffers that are the initial "values" of n(B,0). The TDMA burst number is used as a time index at the bottom of the diagram.

Figure 12:
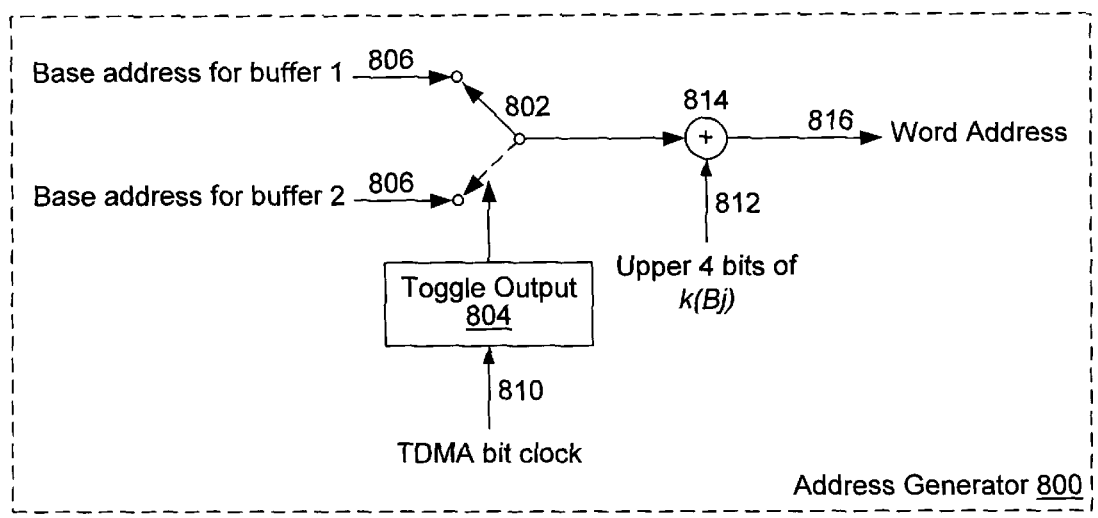
FIG. 12 is a schematic illustration of a method for generating word addresses in the frame buffers according to the present invention.

It can be seen that every two TDMA bursts a new FEC coded speech frame arrives. This means that every two TDMA bursts the initialization of n(B,0) will change. This "initialization" may be reduced to making sure that the buffer to be used as the source of the very first bit in the TDMA burst is the newest one. The circuit of FIG. 12 shows how this may be done. In address generator 800, switch 802 is toggled 804 between frame buffer base addresses 806 and 808 by bit clock 810. To the chosen base address, an offset 812 is added 814 to produce a word address 816 in the frame buffer.

By the nature of the interleaving process, once the last bit in a data block has been interleaved, switch 802 will point to the initial buffer. This is because an even number of bits are being interleaved. For the first two data blocks there need not be any modification to the switch position because the first bit in each of the two data blocks will come from the same initial FEC coded speech frame buffer. However, after a group of two data blocks has been completed it will become necessary to toggle switch 802 an extra time so that it points to the appropriate data buffer. This may be accounted for as part of a state-machine-based control function that controls the initialization of the hardware. This will be discussed further below.

As was described, the circuit shown in FIG. 12 is used to generate the address in data memory of the word that contains the desired bit to be interleaved. The address should be generated in advance of the actual fetch in order to avoid uncertainties in timing. Every time TDMA bit clock 810 makes a transition, a word will be fetched from the frame buffer memory based on an address that was calculated at the previous clock cycle. At the same time, switch 802 shown above will toggle from one position to the other so that the base address for the other buffer may be added to word offset 812 which is the upper four bits from the new k(B,j) that is computed. This process creates the address in data memory that will be ready for the next clock cycle. Then the word will be fetched from memory and at the same time the next address will be computed.

Implementing k(B,j)

Figure 13:
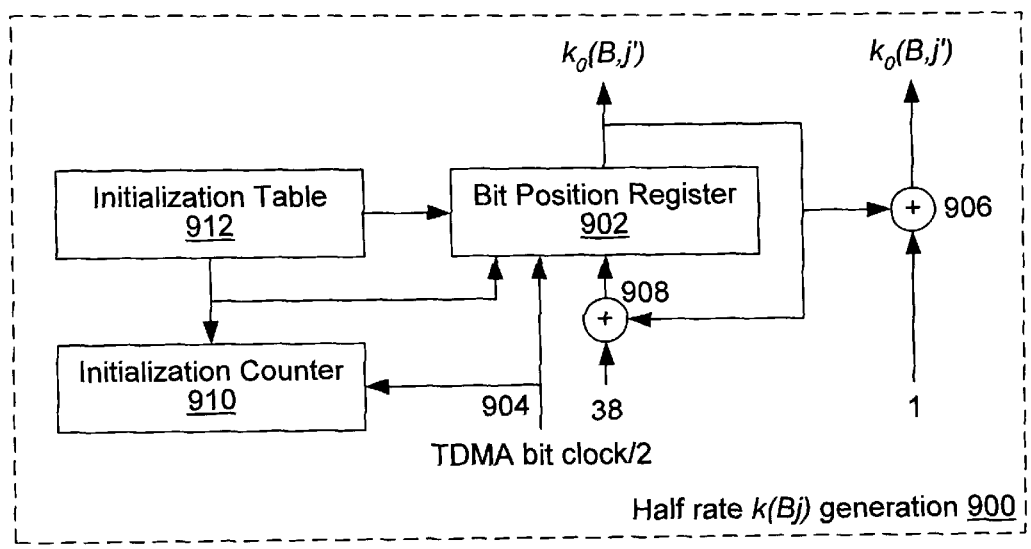
FIG. 13 is a schematic illustration of a method for generating bit position information in the frame buffers according to the present invention.

For the reordering/interleaving of full rate speech two counter-based registers are used to generate values for k(B,j). These are called "counter-based registers" because they have as their source a counter. FIG. 13 shows a a bit position generator 900 for generating two k values, $k_e(B,j')$ for even values of j and $k_o(B,j')$ for odd values of j. The definition of j' is $\lfloor j/2 \rfloor$, since now two bit position values will be generated for each value of j. In FIG. 13, counter 902 is initially provided with a value from the table in FIG. 9 by initialization table 912. Counter 902 then generates the source addresses of the next six bits for one block by latching the input value once every two cycles of TDMA bit clock 810. This is facilitated by clock signal 904, which is derived from TDMA bit clock 810. The output of counter 902 provides the $k_e(B,j)$ value, and it is also forwarded to adders 906 and 908. Adder 906 increments the output of counter 902 by 1, thereby determining the $k_o(B,j')$ value. Adder 908 adds 38 to the output of counter 902, thereby determining the next value of $k_e(B,j')$ to be latched by counter 902. The $k_e(B,j')$ register value is used to address words that are destined for the even bit positions and the $k_o(B,j')$ register value is used to address words that are destined for odd bit positions. Address generator 800 switches between each of these registers values as it fetches words from the two buffers. The switching between the two registers is controlled by the value of j. Initialization counter 910 counts clock cycles and causes initialization table 912 to re-initialize counter 902 with every sixth value of $k_e(B,j')$. Note that this continues even as the first data block ends and the second data block begins, since column 0 of the table in FIG. 8 "wraps" into column 1 of the same table, i.e. the first value of column 1 is obtained by adding 38 to the last value of column 0.

Every time the counter is clocked after being initialized, the value $k_e(B,j'+1)=k_e(B,j')+38$ appears at the output. This new value may then be used to fetch the bit that will be placed into the even bit position in the interleaved bit stream. Since the source of the bit that will be placed into the next odd bit position differs from $k_e(B,j')$ by 1 the output of the $k_e(B,j)$ latch is also input to a combinational logic circuit that computes the desired bit position $k_o(B,j')=k_e(B,j')+1$.

To avoid possible timing conflicts, care must be taken in integrating the k(B,j) generation block with the data memory address generation block. In order to compute the correct data memory address, it is important to have the appropriate value of k(B,j), i.e. $k_o(B,j')$ or $k_e(B,j')$, prior to the fetch cycle.

Implementing the Fetch Circuitry

Figure 14:
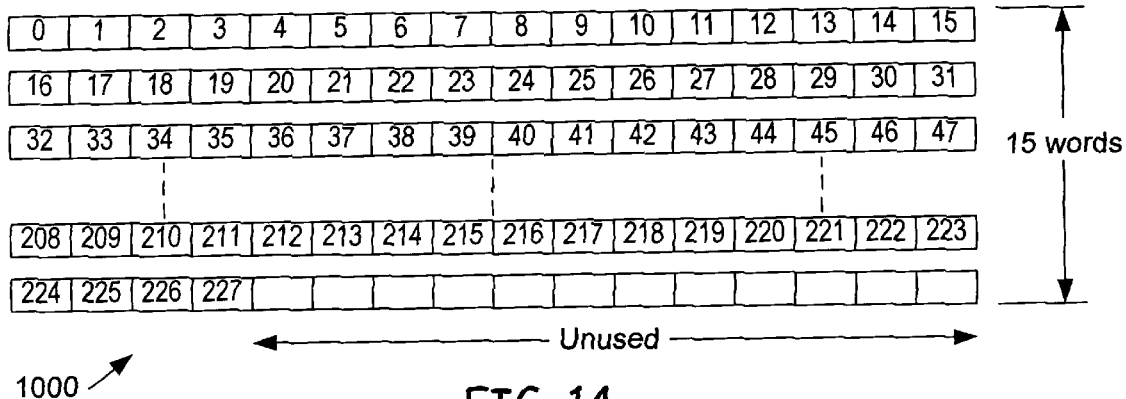
FIG. 14 illustrates a frame buffer.
Figure 15:
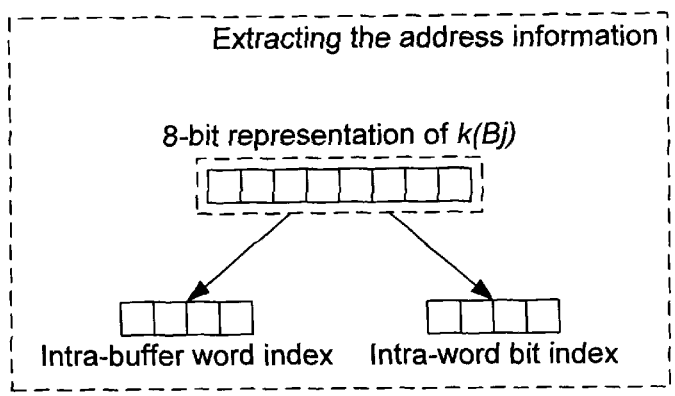
FIG. 15 illustrates a method for obtaining a word offset and a bit offset from the binary representation of the bit position.

In a preferred embodiment, the input FEC coded speech frames are stored in a memory mapped space. The 228-bit frames are stored in buffers that are 15 words long, as illustrated by buffer 1000 in FIG. 14. Two of these buffers are used because the reordering/interleaving process requires data from two consecutive FEC coded speech frames. The bit position k(B,j), which is a number between 0 and 227, must therefore be converted to a word address (word offset) and an intra-word bit position (bit offset). The bit position k(B,j) may be represented using 8 bits as shown in FIG. 15. The word offset and bit offset (i.e. the intra-word bit position) can then be obtained by simply partitioning the binary representation of k(B,j) into two parts. The upper four bits are used as an index to the appropriate word in which the desired bit is located. This is why only the upper four bits of k(B,j) are used in the data memory address generation block 800. The lower four bits are used to select the desired bit within the word that is fetched. This bit is then placed in the $j^{th}$ position of the interleaved output buffer.

It should be noted here that if an encryption mask is to be used on the data block, the source bit may be XOR'd with the corresponding bit in the encryption mask as soon as it is fetched. This advantageously parallelizes the encryption and fetch operations to thereby gain a reduction in the data processing delay.

Figure 16:
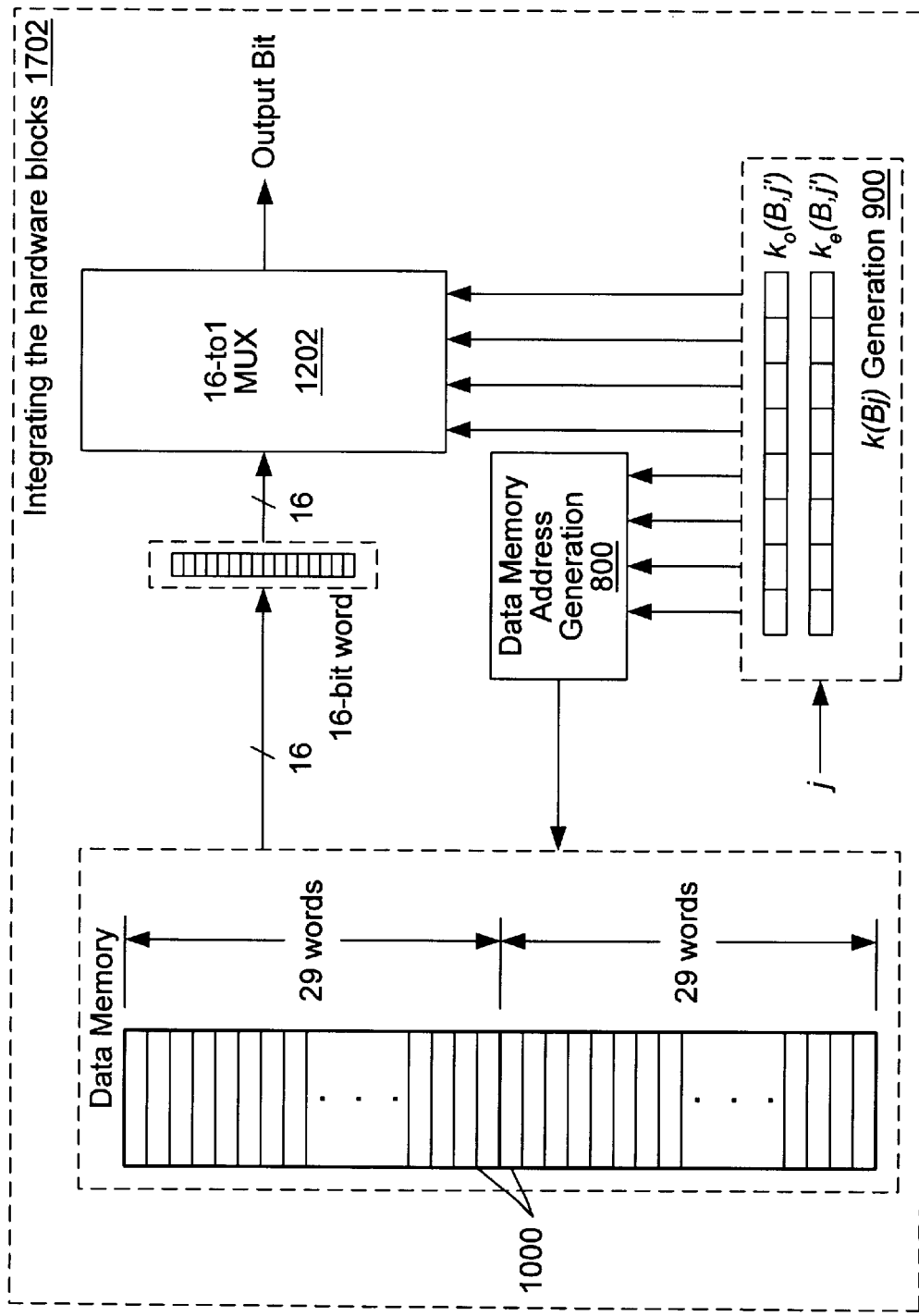
FIG. 16 is a schematic illustration of a module for generating data blocks of reordered bits from FEC coded frames according to the present invention.

FIG. 16 shows a circuit to demonstrate how the described circuits may be integrated and the correct bit from data memory extracted for a given value of k(B,j). The upper four bits of the binary representation of k(B,j) provided by bit position generator 900 are used by a address generator 800 to generate the address in data memory of the desired word. The desired word will be in one of two frame buffers 1000. The lower four bits are used as input to a 16-to-1 MUX 1202. Thus, once the word has been fetched the desired bit is selected using the lower four bits of k(B,j).

In a preferred embodiment, the data memory is common with the rest of the system, and provisions must be made to ensure that there are no conflicts during the read from memory. This is preferably accomplished by configuring the data storage space so that it is write-only from the DSP or microcontroller host and read-only by this hardware.

Control Implementation

The registers and counters must be properly initialized and the various tasks, like address computation and word fetching, must be performed in a correct sequence. There are several tasks that must be performed by the control function, the most primitive of which is to know when to be in the processing state and when to be in idle.

Figure 17:
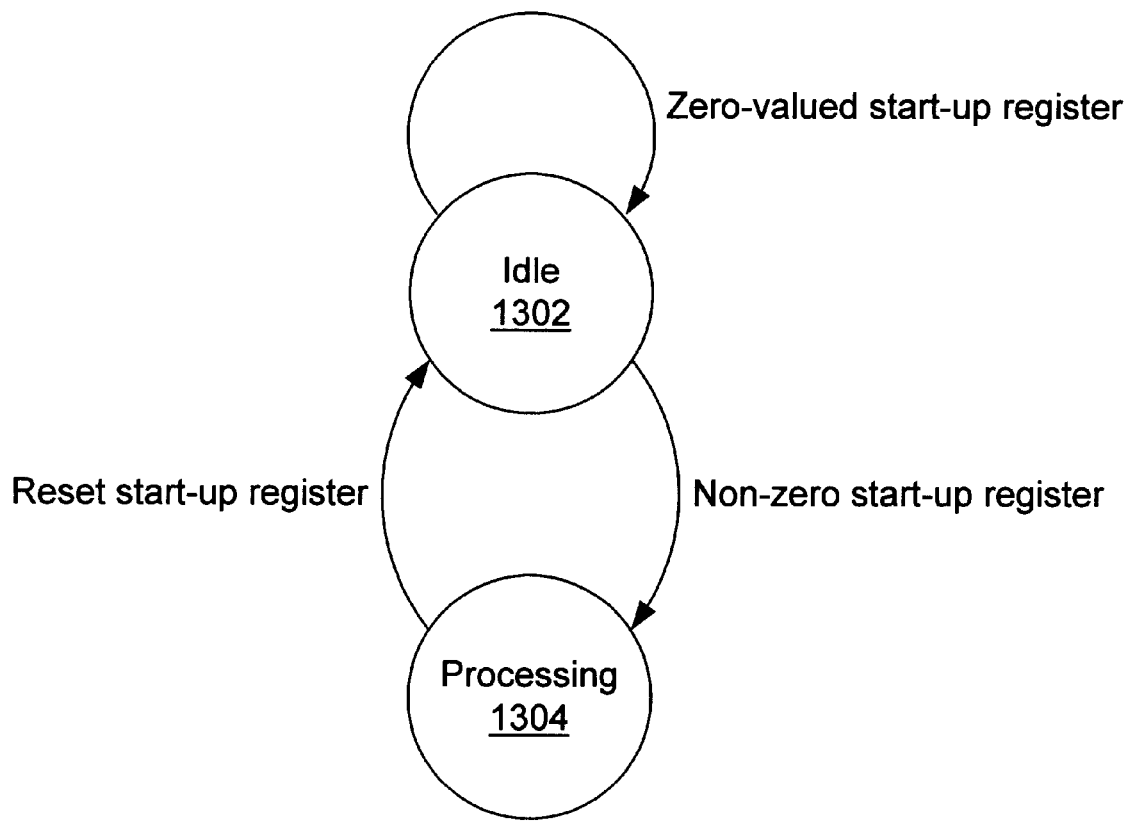
FIG. 17 is a primitive state transition diagram illustrating the initiation and conclusion of the hardware based reordering and interleaving operations.

This may be accomplished using a memory-mapped hardware register that may be accessed by a DSP or microcontroller host. This memory location will not only serve as the start-up indication but also as a valuable port through which modes of operation may be passed to the hardware. For example, the hardware system may be modified to support both full and half rate FEC speech reordering/interleaving. In this case, the start-up register will serve to pass the appropriate rate of operation to the hardware. FIG. 17 shows a state machine to illustrate. The bit interleaving hardware is initially in idle state 1302. Once a non-zero value has been detected, the hardware will enter processing state 1304 and perform the appropriate function and then reset the start-up register to zero as it returns to idle state 1302. This zeroing of the memory mapped register will be an indication to the host processor that the desired function has been completed.

Another important function of the controller is that of initialization. There are two hardware elements that must be initialized—the contents of the k(B,j) generator latch and the n(B,j) switch. The latch that is used to generate values for k(B,j) must be properly initialized in order to produce the correct output sequence. Every second data block requires an extra toggle of the switch, and a return to the beginning of the initialization table. This initialization will ensure that the correct sequence of bit positions is generated and hence the correct bits will be reordered and interleaved.

Figure 18:
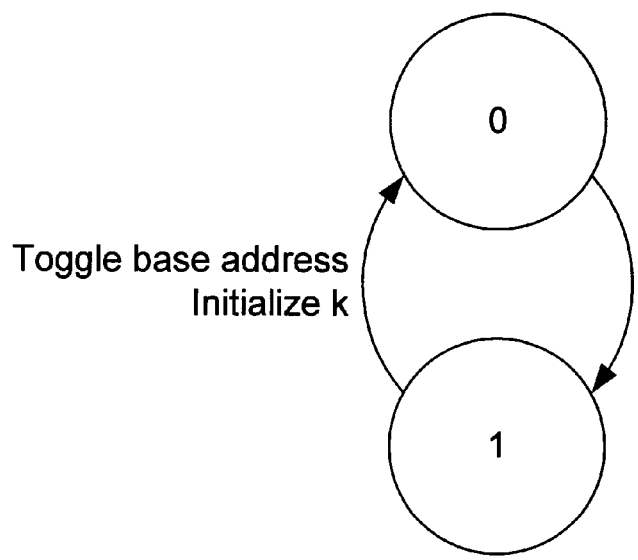
FIG. 18 is a primitive state transition diagram illustrating a method for generating the initialization of the bit position counter and the initialization of the base address switch.

The initialization process may be accomplished by maintaining a flip-flop that is toggled every time the hardware constructs a data block. FIG. 18 shows the state transition diagram of a flip-flop. This flip-flop may be used to control the initialization of the bit position counter and the toggling of the frame buffer switch 802. Thus the next time a data block is to be created, the k(B,j) latch is initialized or retained as appropriate. The extra toggle of switch 802 every time a new frame is placed into a buffer (which is every second data block) ensures that the correct base address will be used when fetching the very first bit in the next data block.

Conclusion

This document has described the implementation of a hardware based reordering/interleaving scheme for half rate speech traffic. Numerous variations and modifications will become apparent to those skilled in the art once the above disclosure is fully appreciated. For example, the method described herein may be executed entirely by a DSP or microprocessor. It is intended that the following claims be interpreted to embrace all such variations and modifications.

What is claimed is:

1. A GSM transmitter module for converting forward error correction coded half-rate speech frames into TDMA data blocks, wherein said transmitter module comprises:
    a memory configured to store said frames in a current frame buffer and a previous frame buffer, wherein said memory is further configured to provide data words from said buffers in response to word addresses;
    an address generator coupled to receive a TDMA bit clock, wherein said address generator is configured to responsively select a base address for the current frame buffer for even cycles of the bit clock, wherein said address generator is configured to responsively select a base address for the previous frame buffer for odd cycles of the bit clock, wherein the address generator adds the selected base addresses to word offsets to produce said word addresses;
    a bit position generator configured to generate said word offsets, wherein the bit position generator is further configured to generate bit offsets; and
    a multiplexer coupled to receive said data words and said bit offsets, wherein said multiplexer is configured to responsively provide a sequence of data bits selected solely from said data words;
    wherein said bit position generator includes:
        a latch configured to sense a next even-cycle bit position and to responsively provide and hold a current even-cycle bit position for two periods of the bit clock;
        a counter configured to count periods of the bit clock and provide an initialization signal; and
        a table coupled to receive said initialization signal and configured to provide said next even-cycle bit position when said initialization signal is asserted.

2. The GSM transmitter module of claim 1, wherein said bit position generator further includes:
    a first adder configured to add a predetermined offset to the current even-cycle bit position and responsively provide a current odd-cycle bit position; and
    a second adder configured to add a predetermined increment to the current even-cycle bit position and responsively provide the next even-cycle bit position when said initialization signal is de-asserted.

3. The GSM transmitter module of claim 2, wherein said predetermined offset is 1, and wherein said predetermined increment is 38.

4. The GSM transmitter module of claim 2, wherein subsequent to said memory storing said current frame, said sequence of data bits is provided to produce two TDMA data blocks, wherein said latch is initialized with a value for a first of said data blocks, and wherein said latch is initialized with subsequent values to provide every sixth current even-cycle bit position.

5. The GSM transmitter module of claim 4, wherein said value is 0 and said subsequent values are 18, 8, 28, 4, 22, 12, 34, 1, 36, 14, 32, 10, 30, 6, 24, 2, 26, and 20.

6. An interleaver for generating a data block from a current frame of half-rate speech data and a previous frame of half-rate speech data, said interleaver comprises:
    a bit position generator coupled to receive a bit clock and configured to generate a sequence of source bit positions, wherein each of said positions includes a word offset and a bit offset;
    an address generator coupled to receive said word offsets and configured to responsively generate a sequence of word addresses;
    a memory configured to store the previous frame and the current frame, wherein said memory is coupled to receive said word addresses and responsively provide a sequence of data words; and
    a multiplexer coupled to receive said data words, coupled to receive said bit offsets, and configured to responsively provide said data block;
    wherein said bit position generator includes:
        a latch configured to sense a next even-cycle bit position and to responsively provide and hold a current even-cycle bit position for two periods of the bit clock;
        a counter configured to count periods of the bit clock and provide an initialization signal; and
        a table coupled to receive said initialization signal and configured to provide said next even-cycle bit position when said initialization signal is asserted.

7. The interleaver of claim 6, wherein said bit position generator further includes:
    a first adder configured to add a predetermined offset to the current even-cycle bit position and responsively provide a current odd-cycle bit position; and
    a second adder configured to add a predetermined increment to the current even-cycle bit position and responsively provide the next even-cycle bit position when said initialization signal is de-asserted.

8. The interleaver of claim 7, wherein the latch is initialized with a value before the interleaver generates a first data block, and wherein the latch is initialized with subsequent values to provide every sixth current even-cycle bit position.

9. The interleaver of claim 7, wherein the address generator comprises:
    a switch coupled to receive a first buffer address and a second buffer address, wherein said switch is configured to produce a sequence of base addresses by toggling between said first buffer address and said second buffer address, wherein said switch is further configured to toggle for each bit in the data block; and
    an adder coupled to receive said base addresses, wherein said adder is configured to add said word offsets to said base addresses to produce said sequence of word addresses.

10. The interleaver of claim 9, wherein the switch is further configured to perform an additional toggle once for every two data blocks.

11. The interleaver of claim 9, wherein the latch is initialized with a value before the interleaver generates a first data block, and wherein the latch is initialized with subsequent values to provide every sixth current even-cycle bit position.

12. The interleaver of claim 7, further comprising an encryption circuit configured to exclusive-or each bit of the data block with a corresponding bit from an encryption mask.

13. A method for generating two data blocks from a current frame of encoded half-rate speech data and a previous frame of encoded half-rate speech data, said method comprises:
    (a) supplying a latch with an initial bit position from a table of initial bit positions;
    (b) latching the initial bit position to provide a current even-bit position;

(c) adding 1 to the current even-bit position to provide an odd-bit position;

(d) adding 38 to the current even-bit position to produce a new even-bit position;

(e) adding 1 to the current even-bit position to provide an odd-bit position;

(f) latching the new even-bit position to provide a current even-bit position;

(g) repeating steps d), (e) and (f) four additional times to generate a subsequence of 12 bit positions;

(h) repeating steps (a) through (g) 18 additional times to generate a sequence of 228 bit positions that can each be split into a word offset and a bit offset;

(i) summing an address for the current frame with a word offset from the current even-bit position;

(j) summing an address for the previous frame with a word offset from the odd-bit position; and (k) repeating steps (i) and (j) 113 additional times to produce a sequence of 228 word addresses from said sequence of 228 bit positions.

14. The method of claim 13, wherein said method further comprises:

applying said sequence of word addresses to a memory containing said frames to obtain a sequence of data words;

selecting from each data word a bit indicated by the corresponding bit offset to produce a sequence of 228 bits.

15. The method of claim 14, wherein said method further comprises encrypting the sequence of 228 bits by performing and exclusive-or operation on each bit with a corresponding bit from an encryption mask.

16. The method of claim 13, wherein said initial bit positions are 0, 18, 8, 28, 4, 22, 12, 34, 16, 36, 14, 32, 10, 30, 6, 24, 2, 26, and 20.

* * * * *

UNITED STATES PATENT AND TRADEMARK OFFICE
CERTIFICATE OF CORRECTION

PATENT NO. : 6,035,434
DATED : March 7, 2000
INVENTOR(S) : Sazzad et al.

It is certified that error appears in the above-identified patent and that said Letters Patent is hereby corrected as shown below:

Claim 5, col. 9, line 62, please delete " 1," and substitute -- 16,--.

Signed and Sealed this

Sixth Day of February, 2001

Attest:

Q. TODD DICKINSON

*Attesting Officer*   *Director of Patents and Trademarks*